United States Patent [19]
Sugayama et al.

[11] Patent Number: 4,833,587
[45] Date of Patent: May 23, 1989

[54] SEMICONDUCTOR SWITCHING CIRCUIT

[75] Inventors: Shigeru Sugayama, Hitachi; Tadaaki Kariya, Ibaraki; Tatsuo Shimura; Sigeo Tomita, both of Hitachi, all of Japan

[73] Assignee: Hitachi Ltd. and Hitachi Haramachi Semi-Conductor Ltd., Tokyo, Japan

[21] Appl. No.: 171,383

[22] Filed: Mar. 21, 1988

[30] Foreign Application Priority Data

Mar. 28, 1987 [JP] Japan .................. 62-72988

[51] Int. Cl.⁴ ............................ H02M 13/18
[52] U.S. Cl. ....................... 363/96; 363/85; 323/351; 307/633; 307/637
[58] Field of Search .............. 363/53, 54, 85, 96, 363/128, 135, 139; 323/349, 351, 289; 307/633, 637

[56] References Cited
U.S. PATENT DOCUMENTS 4,117,350  9/1978  Kalfus et al. ............. 307/633
4,231,083 10/1980  Matsuda et al. .......... 363/96
4,581,542  4/1986  Steigerwald ............. 307/633
4,641,231  2/1987  Walker et al. ........... 363/96

FOREIGN PATENT DOCUMENTS 59-14355  1/1984  Japan.

Primary Examiner—Peter S. Wong
Attorney, Agent, or Firm—Antonelli, Terry & Wands

[57] ABSTRACT

A fraction of current passing through the P-emitter region and N-base region of a thyristor is by-passed to the base-emitter junction of a PNP transistor. The amount of the base current is dependent on the thyristor current. Thus, as the anode current of the thyristor increases, the base current and hence the collector current of the PNP transistor increases. The collector current by-passed to the PNP transistor is fed, via a switch which is closed during the off-time of the thyistor, to the base-collector path of an NPN transistor whose collector and emitter are respectively connected to the gate and cathode of the thyristor. The turn-on voltage across the collector and emitter of the NPN transistor accordingly becomes lower than the gate-cathode voltage of the thyristor. The base-emitter current of the NPN transistor equals the collector current of the PNP transistor, the collector current being a fraction of the anode current by-passed to the PNP transistor. A fraction of the anode current of the turned-on thyristor is utilized as the control power for driving the NPN transistor so that additional external power for turning off the thyristor becomes almost unnecessary.

9 Claims, 4 Drawing Sheets

FIG. IA
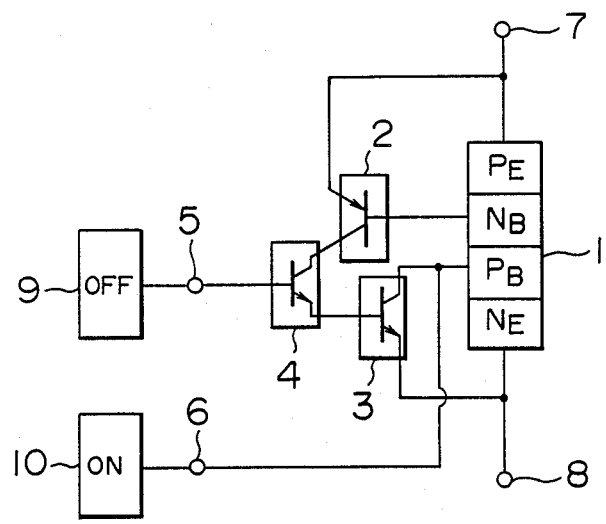
FIG. 3
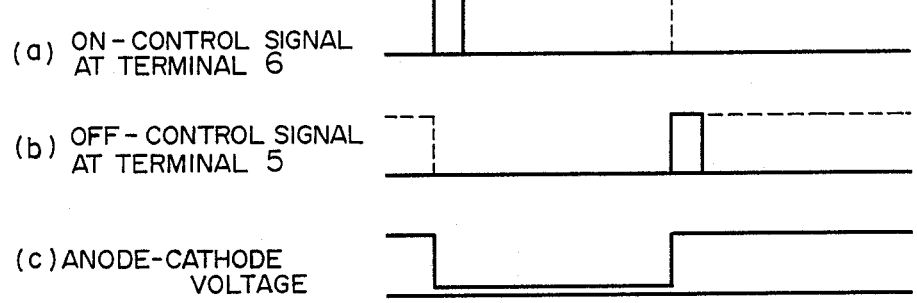
(a) ON-CONTROL SIGNAL AT TERMINAL 6
(b) OFF-CONTROL SIGNAL AT TERMINAL 5
(c) ANODE-CATHODE VOLTAGE FIG. IB
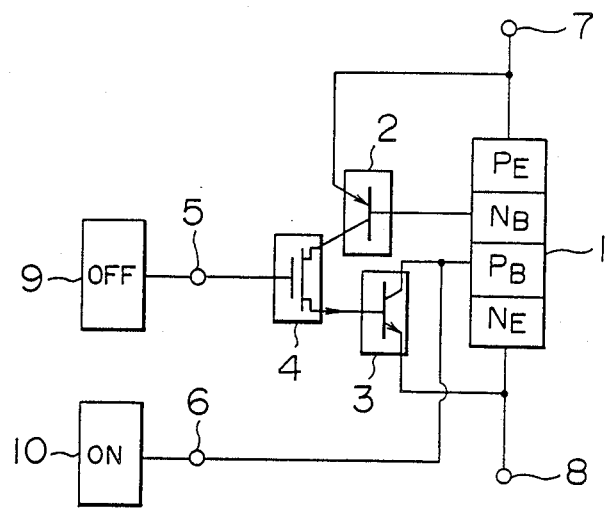

SEMICONDUCTOR SWITCHING CIRCUIT

BACKGROUND OF THE INVENTION

The present invention relates to a semiconductor switching circuit, and more particularly to a semiconductor switching circuit by means of which a drive circuit for a thyristor can operate at low power consumption.

A conventional technique for such a thyristor drive circuit is described, for example, in Japanese Patent Laid-Open Publication JP-A-59-14355. According to this technique, a transistor whose collector and emitter are connected across the gate and cathode of a thyristor, is controlled a short-circuit the gate-cathode path and turn off the thyristor.

Such conventional technique, however, does not consider the amount of drive current for turning off a thyristor. Namely, as the turn-off current of the thyristor increases, the base current of the transistor for short-circuiting the gate-cathode path of the thyristor, i.e., the turn-off drive current for the thyristor, also increases. Thus, there arises a problem that a large drive power is required.

SUMMARY OF THE INVENTION

It is an object of the present invention to provide a drive circuit for turning on and off a thyristor, specifically a switching circuit by means of which the driver circuit for turning off the thyristor can operate at low power consumption.

The above object can be achieved in the following manner. First, a fraction of current passing through the P-emitter region and N-base region of a thyristor is made by-passed to the base-emitter junction of a PNP transistor. While on the other hand an NPN transistor is provided with its collector and emitter connected across the P-base region and N-emitter region of the thyristor. The emitter-collector current by-passed to the PNP transistor is caused to flow into the base-emitter path of the NPN transistor upon application of a turn-off signal. The NPN transistor is then driven to by-pass a fraction of current passing through the P-base region and N-emitter region of the thyristor to the collector-emitter path of the NPN transistor, to accordingly turn off the thyristor.

BRIEF DESCRIPTION OF THE DRAWINGS

FIGS. 1A and 1B are circuit diagrams of a semiconductor switching circuit according to embodiments of the invention;

FIGS. 3(a) to 3(c) illustrate the operation of the circuit of FIG. 1A;

DESCRIPTION OF THE PREFERRED EMBODIMENTS

Figure 2:
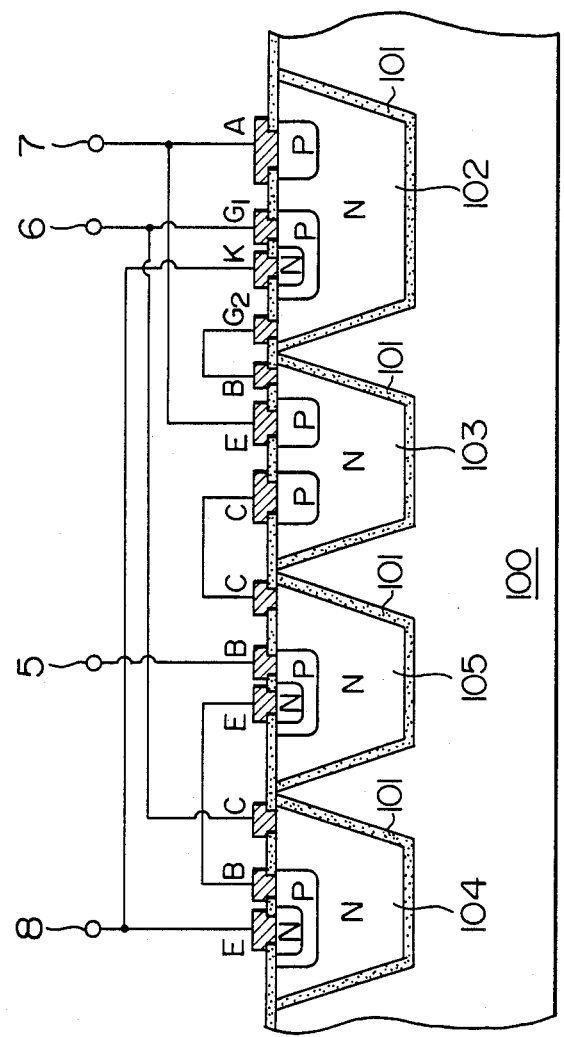
FIG. 2 is a sectional view of an integrated circuit (IC) realizing part of the circuit shown in FIG. 1.

The embodiments of a semiconductor switching circuit of this invention will now be described in detail with reference to the accompanying drawings.

Referring to FIG. 1A showing a circuit diagram of an embodiment of this invention, a semiconductor switching circuit comprises a thyristor 1, a PNP transistor 2, NPN transistors 3 and 4, a turn-off control terminal 5, a turn-on control terminal 6, an anode terminal 7, a cathode terminal 8, a turn-on control signal generator 9 and a turn-off control signal generator 10.

The semiconductor switching circuit of the embodiment shown in FIG. 1A controls the turn-on and -off of the thyristor 1 which is of a four-layer structure including a P-emitter region $P_E$, N-base region $N_B$, p-base region $P_B$ and N-emitter region $N_E$, with the anode terminal 7 and cathode terminal 8 connected to the P-emitter region $P_E$ and N-emitter region $N_E$, respectively. The emitter and base of the PNP transistor 2 are connected across the anode terminal 7 and the N-base region $N_B$ of the thyristor 1. The NPN transistor 3 whose collector and emitter are connected across the N-base region $N_B$ or gate and the cathode terminal 8 of the thyristor 1, is used for short-circuiting the gate-cathode and turning off the thyristor 1. The NPN transistor 4 with the turn-off control terminal 5 connected to its base is used for controlling to pass the collector current of the PNP transistor 2 to the base of the NPN transistor 3.

FIG. 2 is a sectional view showing an integrated circuit of FIG. 1A fabricated on a dielectric isolated semiconductor substrate. Four single crystal islands are formed in a polysilicon layer 100 and surrounded by $SiO_2$ films 101. Within the four islands 102, 103, 104 and 105 there are formed the thyristor 1, PNP transistor 2 and NPN transistors 3 and 4. The PNP transistor 2 is formed as a lateral type transistor. Here, C, B, E show the collector, base and emitter electrode of each transistor, and A, K, $G_1$, $G_2$ show the anode, cathode, grid 1 and grid 2 of the thyristor. The switching circuit shown in FIGS. 1A and 2 may be used for various switching circuits in communication stations.

In order to turn on the thyristor 1 of the switching circuit embodying the present invention constructed as above, a control signal as shown in FIGS. 3(a) is applied to the turn-on control terminal 6 connected to the P-base region $P_B$ or gate of the thyristor 1, to then cause a gate current to pass from the turn-on control terminal 6 to the cathode terminal 8. The control signal may be a short pulse signal as shown by a solid line in FIG. 3(a) or may be applied continuously while the thyristor 1 remains turned on as shown by a broken line. While turning on the thyristor 1, no control signal is applied to the turn-off control terminal 5 so that the NPN transistor 4 and NPN transistor 3 are held in a turn-off state.

When the thyristor 1 turns on by a control signal applied to the turn-on control terminal 6, current flows from the anode terminal 7 to the cathode terminal 8. As a result, a potential difference appears between the P-emitter region $P_E$ and N-base region $N_B$ of the thyristor 1 to forward-bias the base-emitter of the PNP transistor 2 and turns it on. However, since the NPN transistor 4 is held in a turn-off state as discussed previously, a collector current of the PNP transistor 2 cannot be derived therefrom, thus maintaining the turn-on state of the thyristor 1. The voltage across the anode terminal 7 and cathode terminal 8 of the thyristor 1 in this state is shown in FIG. 3(c), the voltage corresponding to the on-state voltage drop of the thyristor 1 supplying electric power to a load (not shown).

In order to turn on the thyristor 1, the control signal applied to the turn-off control terminal 6 is removed to stop the current passing from the turn-on control terminal 6 to the cathode terminal 8, and a control signal is applied to the turn-off control terminal 5 to turn on the NPN transistor 4. As a result, the PNP transistor 2 held in an on-state can deliver its collector current, via the collector and emitter of the NPN transistor 4, to the base of the NPN transistor 3 as its base current. The NPN transistor 3 turns on when the base current flows through the base-emitter path. The collector-emitter voltage of the NPN transistor 3 accordingly becomes lower than the voltage across the P-base region $P_B$ and N-emitter region $N_E$ of the thyristor, i.e., the voltage across the gate and cathode of the thyristor 1. Therefore, a fraction of the anode current passing through the P-base region $P_B$ of the thyristor 1 is by-passed as the collector current of the NPN transistor 3 to the cathode terminal 8. By the above operation, the thyristor 1 is made turned off.

With the turn-off control as above, a control current caused to flow through the base-emitter path of the NPN transistor 3 is supplied, via the PNP transistor 2 and NPN transistor 4, by a fraction of the anode current passing through the thyristor as a load current. Therefore, the electric power of a control signal applied to the turn-off control terminal 5 is a minute power sufficient for driving the base of the NPN transistor 4 and turning it on. In order to turn off the thyristor 1, it becomes sufficient if a current in the order of 30% of the current I passing through the P-base region and N-emitter region of the thyristor 1 be fed to the collector-emitter path of the NPN transistor 3. To this end, it becomes necessary to feed a current in the order of 1% of the current I to the base-emitter path of the NPN transistor 3. According to the present invention, this current in the order of 1% is supplied from the emitter-collector current of the PNP transistor 2 so that a current to be applied to the terminal 5 becomes $1/h_{FE}$(transistor 4) of 1% of the current I. The value of $h_{FE}$ is usually about 30, thus resulting in a drive power of one thirties as compared with a conventional circuit.

According to a further aspect of the present invention, since a voltage between the N-base region and P-emitter region of the thyristor 1 is applied across the base and emitter of the PNP transistor 2, the current by-passed by the NPN transistor 3 can be regulated always to an optimum value (due to a so-called Miller effect). In particular, the voltage applied to the base-emitter is essentially dependent on a current passing through the thyristor 1 (a current obtained by subtracting the current entering to the terminal 7 by the current by-passed to the emitter of the PNP transistor 2, such current is hereinafter called a thyristor current). Therefore, the current passing through the emitter-collector path of the PNP transistor 2 is dependent on the thyristor current. The current by-passed to the PNP transistor 2 is used as the collector current of the NPN transistor 3. In conclusion, the current to be by-passed to the NPN transistor 3 depends on the thyristor current so that the by-passed current is always regulated in amount to such a degree as necessary for turning off the thyristor 1 (in the order of 30% of the thyristor current).

Therefore, while completely turning off the thyristor 1 of the switching circuit of this invention, the current passing through the emitter-collector path of the PNP transistor 2 and that passing through the base-emitter path of the NPN transistor 3 become zero even if the NPN transistor 4 is maintained turned on (because the thyristor current is zero). Therefore, according to this invention, the control signal applied to the turn-off control terminal 5 may be a short pulse signal shown by a solid line in FIG. 3(b) or may be continuously applied during the whole period of turning off the thyristor 1 as shown by a broken line (even with continuous application of a control signal, unnecessary current does not flow due to a so-called Miller effect). Assuming that the control signal is continuously applied, even if a voltage regenerates across the anode and cathode of the thyristor 1, the collector voltage of the PNP transistor 2 rises and the $h_{FE}$ thereof increases so that it becomes possible to further lower the collector-emitter voltage of the NPN transistor 3, thus suppressing the possibility of re-trigger phenomenon.

Figure 4:
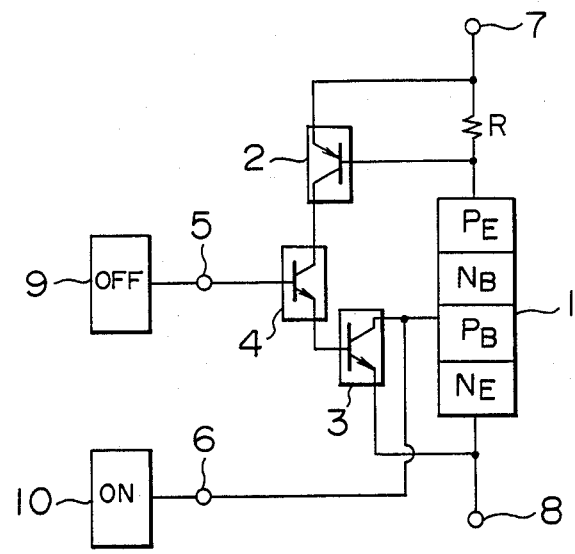
FIG. 4 is a circuit diagram showing another embodiment of the invention.

FIG. 4 shows another embodiment, wherein connected between the terminal 7 and the thyristor 1 is a resistor R having a small resistance (enough to obtain a voltage for conducting a PNP transistor 2, e.g., about 0.7 volt), the voltage across the resistance R being applied to the base-emitter of the PNP transistor 2. The operation of this circuit is similar to the embodiment shown in FIG. 1. Reference numbers used in FIG. 4 correspond to those in FIG. 1A.

Figure 5:
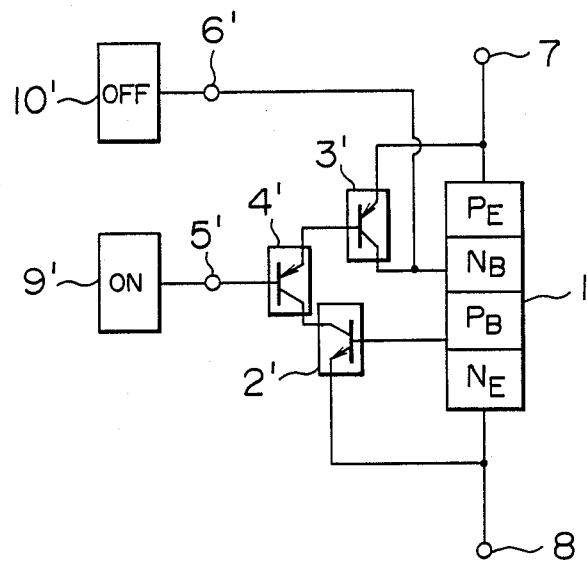
FIG. 5 is a circuit diagram showing a further embodiment of the invention.

FIG. 5 shows a further embodiment, wherein a turn-on control signal is applied to the N-base region, while the current passing through the P-emitter region and N-base region is by-passed to a PNP transistor 3' to turn on the thyristor 1. In particular, the voltage across the P-base region and N-emitter region is applied to the base-emitter of an NPN transistor 2' whose collector is connected via a PNP transistor 4' (to the base of which a turn-off control signal is applied) to the base of a PNP transistor 3'. The operation of this circuit is similar to the embodiment shown in FIG. 1A. Reference numbers corresponding to those in FIG. 1A are given a suffix (').

In the above embodiments, the NPN transistor 4 or 4' may use other switch elements such as MOSFETs which are turned on by a turn-off control signal applied to the terminal 5 or 5' and causes the collector current of the PNP transistor 2 or 2' to enter into the base of the NPN transistor 3 or 3'. An example of this can be seen in FIG. 1B which corresponds to FIG. 1A except for the use of a MOSFET as the transistor 4 in place of an NPN transistor.

As appreciated from the foregoing description of the present invention, the turn-on and -off control of a thyristor can be effected with a minute control current, particularly for the turn-off control, thus realizing a low power consumption for a thyristor control.

We claim:
1. A semiconductor switching circuit under control by turn-on and -off signals, including:
a switching device having four semiconductor regions with a different conductivity type arranged side by side;
a first, a second and a third terminals of said switching device, said first terminal connected to one of the outermost semiconductor regions, said second terminal connected to the other of the outermost semiconductor regions and said third terminal connected to one of the intermediate semiconductor regions;
a unit for generating an on-control signal for turning on said switching device, said on-control signal being applied to said third terminal;
a unit for generating an off-control signal for turning off said switching device;
a first transistor whose collector and emitter are connected between said one of the intermediate semi- conductor regions and said second terminal, respectively;

a second transistor whose base and emitter are connected between the other of the intermediate semiconductor regions of said switching device and said first terminal, respectively, a fraction of current passing through said switching device being by-passed to the base-emitter path of said second transistor, depending on the amount of said current; and switching means responsive to said off-control signal for connecting the collector of said second transistor to the base of said first transistor whereby the collector current of said second transistor is used as the base current of said first transistor to by-pass a fraction of current passing through said one of the intermediate semiconductor regions of said switching device and said second terminal to the collector-emitter path of said first transistor and turn off said switching device.

2. A semiconductor switching circuit according to claim 1, wherein said switching means is a third transistor having a collector connected to the collector of said second transistor, an emitter connected to the base of said first transistor, and a base applied with said turn-off signal.

3. A semiconductor switching circuit according to claim 1, wherein said third transistor is a MOSFET.

4. A semiconductor switching circuit according to claim 2, wherein said four semiconductor regions include P, N, P and N semiconductor regions arranged in this order, said one of the outermost semiconductor regions being a P semiconductor region and said other of the outermost semiconductor regions being an N semiconductor region, and wherein said first and third transistors are NPN transistors, and said second transistor is a PNP transistor.

5. A semiconductor switching circuit according to claim 2, wherein said four semiconductor regions includes P, N, P and N semiconductor regions arranged in this order, said one of the outermost semiconductor regions being an N semiconductor region and said other of the outermost semiconductor regions being a P semiconductor region, and wherein said first and third transistors are PNP transistors, and said second transistor is an NPN transistor.

6. A semiconductor switching circuit under control by turn-on and -off signals, including:

a switching device having four semiconductor regions with a different conductivity type arranged side by side;

a first, a second and third terminals of said switching device, said first terminal connected to one of the outermost semiconductor regions, said second terminal connected to the other of the outermost semiconductor regions and said third terminal connected to one of the intermediate semiconductor regions;

a unit for generating an on-control signal for turning on said switching device, said on-control signal being applied to said third terminal;

a unit for generating an off-control signal for turning off said switching device;

first switching means for by-passing a fraction of current passing through said one of the intermediate semiconductor regions and an outermost semiconductor region adjacent thereto;

second switching means for by-passing a fraction of current passing through said switching device, depending on the amount of said current; and third switching means responsive to said off-control signal for supplying a current by-passed by said second switching means to said first switching means to regulate the amount of a current by-passed by said first switching means.

7. A semiconductor switching circuit according to claim 6, wherein the amount of current by-passed by said second switching means is regulated by a potential difference between the other of the intermediate semiconductor regions and an outermost semiconductor region adjacent thereto.

8. A semiconductor switching circuit according to claim 6, wherein the amount of current by-passed by said second switching means is regulated by a potential difference across a resistor connected to said first terminal.

9. A semiconductor switching circuit according to claim 6, wherein said turn-off signal is continuously applied while said switching device remains turned off.

* * * * *

UNITED STATES PATENT AND TRADEMARK OFFICE
CERTIFICATE OF CORRECTION

PATENT NO. : 4,833,587
DATED : May 23, 1989
INVENTOR(S) : S. Sugayama et al

It is certified that error appears in the above-identified patent and that said Letters Patent is hereby corrected as shown below:

On the Title Page, left-hand column:

"[73] Assignees:  Hitachi, Ltd. and Hitachi Haramachi
                  Semi-Conductor Ltd., Tokyo, Japan"

should read:

--[73] Assignees:  Hitachi, Ltd., Tokyo, Japan and
                   Hitachi Haramachi Semi-Conductor Ltd., Hitachi-shi,
                   Japan--

Signed and Sealed this

Sixteenth Day of October, 1990

*Attest:*

HARRY F. MANBECK, JR.

*Attesting Officer*  *Commissioner of Patents and Trademarks*